US012635429B2

(12) United States Patent
Saly et al.

(10) Patent No.: US 12,635,429 B2
(45) Date of Patent: May 19, 2026

(54) METHODS OF DEPOSITING SiCON WITH C, O, AND N COMPOSITIONAL CONTROL

(71) Applicant: Applied Materials, Inc., Santa Clara, CA (US)

(72) Inventors: Mark Saly, Santa Clara, CA (US); David Thompson, San Jose, CA (US); Thomas Knisley, Livonia, MI (US); Bhaskar Jyoti Bhuyan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/378,843

(22) Filed: Oct. 11, 2023

(65) Prior Publication Data

US 2024/0047193 A1 Feb. 8, 2024

Related U.S. Application Data

(60) Continuation of application No. 17/068,188, filed on Oct. 12, 2020, now Pat. No. 11,823,893, which is a
(Continued)

(51) Int. Cl.
*H10P 14/692* (2026.01)
*H10P 14/60* (2026.01)

(52) U.S. Cl.
CPC ...... *H10P 14/6927* (2026.01); *H10P 14/6336* (2026.01); *H10P 14/6339* (2026.01);
(Continued)

(58) Field of Classification Search
CPC ........... H01L 21/0214; H01L 21/02126; H01L 21/02211; H01L 21/02216;
(Continued)

(56) References Cited

U.S. PATENT DOCUMENTS 7,244,683 B2 7/2007 Chung et al.
8,048,484 B2 11/2011 Rahtu
(Continued)

FOREIGN PATENT DOCUMENTS

CN 108987300 A 12/2018
EP 2669249 B1 12/2013
(Continued)

OTHER PUBLICATIONS

Final Office Action in U.S. Appl. No. 16/950,096 dated Jan. 27, 2022, 21 pages.
(Continued)

*Primary Examiner* — Dah-Wei D. Yuan
*Assistant Examiner* — Nga Leung V Law
(74) *Attorney, Agent, or Firm* — SERVILLA WHITNEY LLC

(57) ABSTRACT

Methods of forming SiCON films comprising sequential exposure to a silicon precursor and a mixture of alkanolamine and amine reactants and an optional plasma are described. Methods of forming a silicon-containing film comprising sequential exposure to a silicon precursor and an epoxide with an optional plasma exposure are also described.

10 Claims, 3 Drawing Sheets

Related U.S. Application Data division of application No. 15/486,838, filed on Apr. 13, 2017, now Pat. No. 10,804,094.

(60) Provisional application No. 62/441,293, filed on Dec. 31, 2016, provisional application No. 62/332,867, filed on May 6, 2016.

(52) U.S. Cl.
CPC ...... *H10P 14/6682* (2026.01); *H10P 14/6686* (2026.01); *H10P 14/6922* (2026.01)

(58) Field of Classification Search
CPC ........... H01L 21/02274; H01L 21/0228; C23C 16/308; C23C 16/4554; C23C 16/45553
See application file for complete search history.

(56) References Cited

U.S. PATENT DOCUMENTS

| | | | | |
|---|---|---|---|---|
| 9,455,138 | B1 * | 9/2016 | Fukazawa | H01L 21/0228 |
| 9,692,009 | B2 | 6/2017 | Lang et al. | |
| 11,447,865 | B2 | 9/2022 | Zhang et al. | |
| 2004/0004859 | A1 | 1/2004 | Forbes et al. | |
| 2007/0123060 | A1 | 5/2007 | Rahtu | |
| 2008/0063798 | A1 * | 3/2008 | Kher | C23C 16/45561 427/255.394 |
| 2012/0122302 | A1 | 5/2012 | Weidman | |
| 2013/0098477 | A1 | 4/2013 | Yudovsky et al. | |
| 2013/0210241 | A1 | 8/2013 | Lavoie et al. | |
| 2014/0141674 | A1 | 5/2014 | Galbreath et al. | |
| 2014/0356549 | A1 | 12/2014 | Varadarajan | |
| 2015/0162185 | A1 | 6/2015 | Pore | |
| 2015/0376211 | A1 | 12/2015 | Girard et al. | |
| 2016/0111272 | A1 | 4/2016 | Girard et al. | |
| 2016/0293398 | A1 | 10/2016 | Danek et al. | |
| 2017/0140924 | A1 * | 5/2017 | Suzuki | H01L 21/0228 |
| 2017/0140925 | A1 | 5/2017 | Suzuki et al. | |
| 2017/0323782 | A1 | 11/2017 | Suzuki et al. | |
| 2018/0087150 | A1 * | 3/2018 | Kerrigan | C23C 16/45553 |
| 2018/0286676 | A1 | 10/2018 | Tak et al. | |
| 2019/0074172 | A1 | 3/2019 | Susa et al. | |
| 2019/0163056 | A1 | 5/2019 | Maes et al. | |
| 2019/0311894 | A1 | 10/2019 | Girard et al. | |
| 2020/0248309 | A1 | 8/2020 | Wang et al. | |
| 2021/0050368 | A1 | 2/2021 | Han | |
| 2021/0062341 | A1 | 3/2021 | Bhuyan et al. | |

FOREIGN PATENT DOCUMENTS

| | | | | |
|---|---|---|---|---|
| EP | 3553204 | A2 | 10/2019 | |
| JP | H0892484 | A | 4/1996 | |
| KR | 20040080755 | A | 9/2004 | |
| WO | WO-2004008827 | A2 * | 1/2004 | H01L 21/0228 |
| WO | 2009055340 | A1 | 4/2009 | |

OTHER PUBLICATIONS

Non-Final Office Action in U.S. Appl. No. 16/950,096 dated Apr. 5, 2022, 11 pages.

Non-Final Office Action in U.S. Appl. No. 16/950,096 dated Sep. 14, 2021, 13 pages.

Non-Final Office Action in U.S. Appl. No. 17/848,600 dated Sep. 8, 2023, 11 pages.

Ahn, Dongjoon , et al., "Thermodynamic measurements pertaining to the hysteretic intercalation of lithium in polymer-derived silicon oxycarbide", Journal of Power Sources 195 (2010), 3900-3906.

Chen, Meixi , et al., "Deposition of SiOC by plasma-free ultra-low-temperature ALD (ULT-ALD) and its passivation on p-type silicon", 2017 IEEE 44th Photovoltaic Specialist Conference (PVSC), Washington, DC, USA, 2017, pp. 326-328.

Closser, Richard G., "Molecular Layer Deposition of a Highly Stable Silicon Oxycarbide Thin Film Using an Organic Chlorosilane and Water", ACS Appl. Mater. Interfaces 2018, 10, 24266-24274.

Johnson, Andrew L., et al., "Recent developments in molecular precursors for atomic layer deposition", Organomet. Chem., 2019, 42, 1-53.

Kim, Hyunjun , "Characteristics Of Silicon Oxycarbide Thin Films Deposited By Atomic Layer Deposition For Low-K Gate Spacer", Graduate School of Hanyang University, Thesis for the Master of Science, Feb. 2019, 1-48.

Lee, Jaemin , et al., "Characteristics of low-k SiOC films deposited via atomic layer deposition", Thin Solid Films 645 (2018), 334-339.

Lee, Kwang-Man , et al., "Characteristics of SiOC(-H) Thin Films Prepared by Using Plasma-enhanced Atomic Layer Deposition", Journal of the Korean Physical Society, vol. 59, No. 5, Nov. 2011, pp. 3074-3079.

Uznanski, Pawel , et al., "Surface modification of silicon oxycarbide films produced by remote hydrogen microwave plasma chemical vapour deposition from tetramethyldisiloxane precursor", Surface & Coatings Technology 350 (2018) 686-698.

Walkiewicz-Pietrzykowska, Agnieszka , et al., "Type of precursor and synthesis of(SiOxCyH) thin films with a surfatron microwave oxygen/argon plasma", J. Vac. Sci. Technol. A 24(4), Jul./Aug. 2006, pp. 988-994.

* cited by examiner

METHODS OF DEPOSITING SiCON WITH C, O, AND N COMPOSITIONAL CONTROL

CROSS-REFERENCE TO RELATED APPLICATIONS

This application is a continuation application of U.S. patent application Ser. No. 17/068,188, filed Oct. 12, 2020, which is a divisional application of U.S. patent application Ser. No. 15/486,838, filed Apr. 13, 2017, issued as U.S. Pat. No. 10,804,094, on Oct. 13, 2020, which claims priority to U.S. Provisional Application No. 62/332,867, filed May 6, 2016 and U.S. Provisional Application No. 62/441,293, filed Dec. 31, 2016, the entire disclosures of which are hereby incorporated by reference herein.

TECHNICAL FIELD

The present disclosure generally relates to methods of depositing thin films. In particular, the disclosure relates to methods of depositing silicon containing films with carbon, oxygen and nitrogen.

BACKGROUND

Low dielectric constant (k) silicon-based films are often used in the manufacturing of microelectronics. One application for low k films is as a spacer with low wet etch rate (~0 Å/min in 1:100 HF) and a k value of ~4.2. The spacer material may also have a low wet etch rate after being exposed to a moderate $O_2$ plasma (e.g., ~2 KW remote plasma).

Historically, silicon-based low k films have been deposited by ALD in a furnace chamber. To achieve chosen film properties, the film is often deposited at temperatures greater than 500° C. in the furnace chamber. With the thermal budgets continually decreasing with each chip node, there is a need for methods of depositing low k films at temperatures below 500° C.

Deposition of SiCO films by atomic layer deposition (ALD) using typical oxidation sources (e.g., $H_2O$ or $O_2$) results in the majority of carbon being oxidized leading to a film with low carbon content. Carbon levels greater than about 10% can drastically decrease the etch rates and may also help decrease the dielectric constant of the film. Therefore, there is a need in the art for methods of depositing low k films with relatively high carbon content.

SUMMARY

One or more embodiments of the disclosure are directed to methods of depositing a silicon-containing film. The methods comprise sequentially exposing a substrate surface to a silicon precursor and a reactant. The reactant comprises one or more of an epoxide or alcohol.

Additional embodiments of the disclosure are directed to methods of depositing a silicon-containing film. A substrate having a surface is positioned in a processing chamber. The surface of the substrate is exposed to a silicon precursor comprising a silylamine and substantially no halogen atoms. The unreacted silicon precursor is purged from the surface of the substrate. The surface of the substrate is exposed to a reactant consisting essentially of an epoxide and comprising substantially no nitrogen atoms to form the silicon-containing film. The epoxide has a structure represented by one or more of

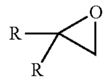

where each R is independently H, C1-C10 alkyl, C1-C10 alkenyl, C1-C10 alkynyl, cycloalkyl with 1 to 10 carbons, ether or silane or

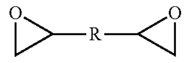

where R is a C1-C10 alkyl, C1-C10 alkenyl, C1-C10 alkynyl, cycloalkyl with 1 to 10 carbons, ether or silane. The unreacted reactant is purged from the surface of the substrate. Exposure to the silicon precursor, purging unreacted silicon precursor, exposure to the reactant and purging unreacted reactant is repeated to form a silicon-containing film having a thickness.

Further embodiments of the disclosure are directed to methods of depositing a silicon-containing film. A substrate having a surface is positioned in a first process region of a processing chamber. The surface of the substrate is exposed to a silicon precursor comprising a silylamine in the first process region. The substrate is laterally moved through a gas curtain to a second process region of the processing chamber. The gas curtain purges unreacted silicon precursor from the surface of the substrate. The surface of the substrate is exposed to a reactant in the second process region of the processing chamber to form the silicon-containing film. The reactant comprises an epoxide and has substantially no halogen or nitrogen atoms. The epoxide has a structure represented by

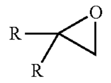

where each R is independently H, C1-C10 alkyl, C1-C10 alkenyl, C1-C10 alkynyl, cycloalkyl with 1 to 10 carbons, ether or silane, or

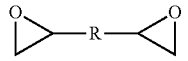

where R is a C1-C10 alkyl, C1-C10 alkenyl, C1-C10 alkynyl, cycloalkyl with 1 to 10 carbons, ether or silane. The reactant further comprises a reactant plasma comprising 25% $H_2$ in Ar. The substrate is laterally moved through a gas curtain to a third process region of the processing chamber. The gas curtain purges unreacted reactant from the surface of the substrate. The surface of the substrate is optionally exposed to a plasma in the third region of the processing chamber and laterally moved from the third region of the processing chamber through a gas curtain. The plasma comprises argon with greater than or equal to about 5% hydrogen on a molecular basis. The exposure to the first process region, the second process region and, optionally, the third process region is repeated to grow a silicon-containing film having a thickness. The silicon-containing film comprises greater than about 10% carbon on an atomic basis and the silicon-containing film has a wet etch rate ratio of less than or equal to about 0.1.

BRIEF DESCRIPTION OF THE DRAWINGS

So that the manner in which the features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
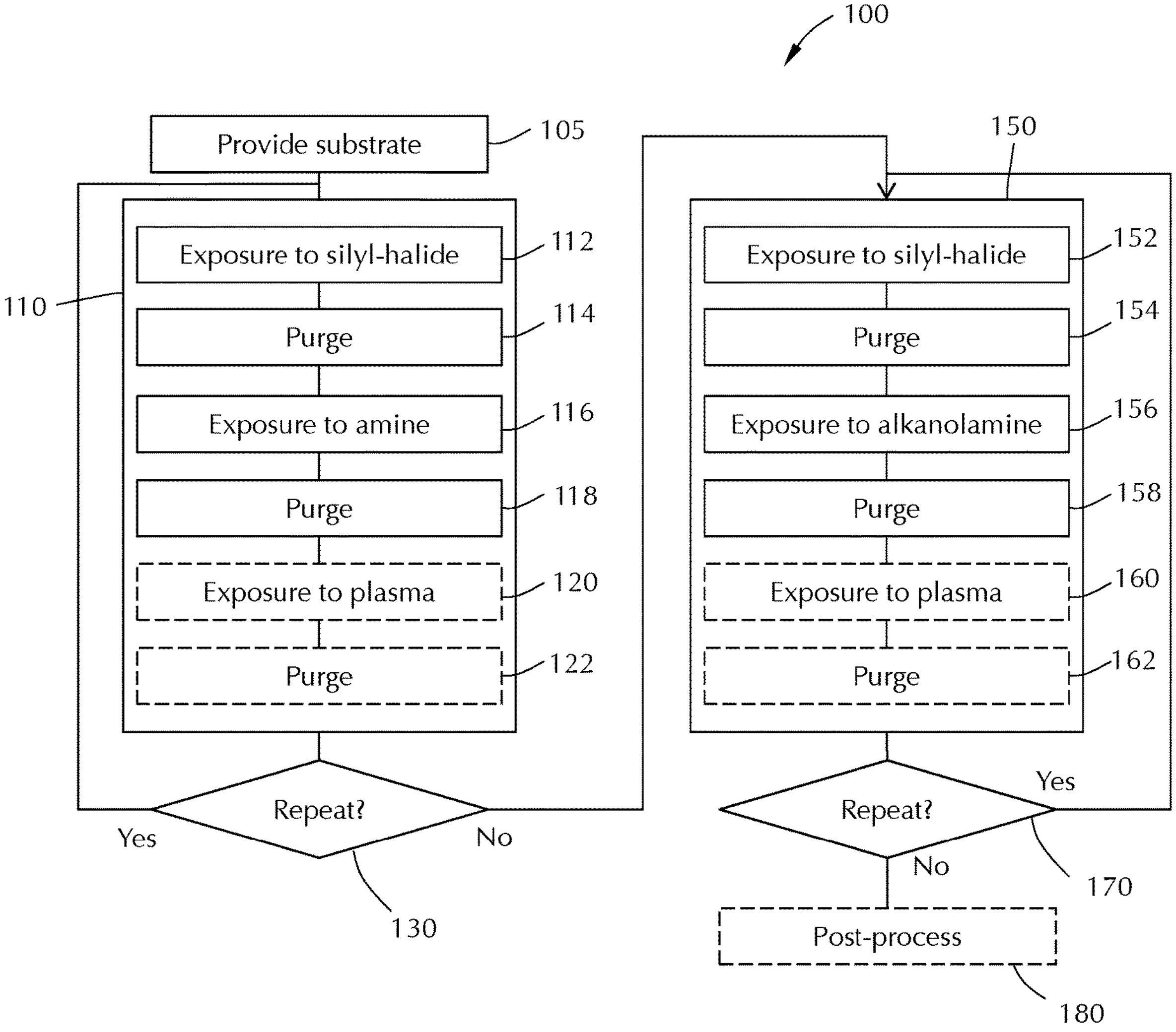
FIG. 1 shows a schematic representation of a process sequence in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Atomic layer deposition (ALD) can be performed by either a time-domain process or a spatial process. In a time-domain process, the substrate is exposed to a first reactive gas in a processing chamber. The first reactive gas is removed, or purged, from the processing chamber prior to flowing the second reactive gas into the processing chamber. Only one reactive gas is present in the processing chamber at a time. In a spatial ALD process, the various reactive gases are flowed into separate sections of a processing chamber and the substrate is moved between the different sections to allow sequential exposure. The sections of the processing chamber are separated by a gas curtain (e.g., a combination of purge gas streams and exhaust streams) to prevent or minimize gas phase mixing of the reactive gases.

Some embodiments of the disclosure advantageously provide methods of depositing silicon containing low k dielectric films at temperatures below 500° C. Some embodiments advantageously provide methods that afford low k silicon-based films with carbon, oxygen and nitrogen compositions. One or more embodiments advantageously provide methods of tuning the carbon, oxygen and nitrogen content of the silicon-based dielectric using organic based reagents (e.g., amines, alcohols and alkanolamines) in combination with various silylhalides or siloxane precursors.

In some embodiments, SiCON, also referred to as silicon oxycarbonitride, is deposited using an amine as the carbon and nitrogen source and an alkanolamine as the carbon, nitrogen and oxygen source. FIG. 1 shows a process 100 in accordance with one or more embodiment of the disclosure. At 105, a substrate is provided for processes. As used in this regard, the term "provided" means that the substrate is positioned in a suitable processing environment (e.g., within a processing chamber). The pulsing sequence shown in FIG. 1 is merely representative of one possible method and should not be taken as limiting the scope of the disclosure. Briefly, a pulse of silyl-halide, purge, amine, purge and optional plasma activation is followed by a pulse of silyl-halide, purge, alkanolamine (as a carbon, nitrogen and oxygen source), purge and optional plasma activation.

The process 100 can be viewed as having a first sub-process 110 and a second sub-process 150. In the first sub-process 110, at 112, the substrate is exposed to a silyl-halide compound. Suitable silyl halide compounds include, but are not limited to, dichlorosilane, hexachlorodisilane, trichlorosilane, tetrachlorosilane, fluorides, bromides, iodides, and combinations thereof. The silyl-halide precursor can include any suitable silicon precursor that can react with the substrate surface. The silicon-containing precursor can be halogenated or non-halogenated. A halogenated precursor means that at least one halogen atom is bound to a silicon atom. Suitable silicon halide include, but are not limited to, $SiCl_4$, monochlorosilane, dichlorosilane, trichlorosilane, silane, disilane, organosilicates, aminosilanes and organosilanes. In some embodiments, the silicon-containing precursor consists essentially of silicon halide.

As used in this regard, "consists essentially of silicon halide" means that the gas flow contains substantially only silicon halide as a surface active component. Other non-reactive gases, for example, carrier gases, can be included.

At 114, after exposure to the silyl-halide, the process chamber, or region adjacent the substrate surface is purged of unreacted silyl-halide and by-products. Purging can be accomplished by removing all reactive gases from the processing chamber, or by passing the substrate through a gas curtain that isolates the silyl-halide to a particular region of the processing chamber. Suitable purge gases include, but are not limited to, nitrogen, argon, helium, hydrogen and mixtures thereof.

At 116, the substrate is exposed to an amine. Suitable amines include, but are not limited to, primary amines, secondary amines and tertiary amines. In some embodiments, the amines comprise one or more of

1

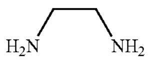

2

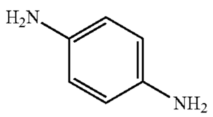

3

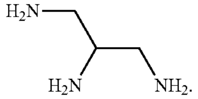

In some embodiments, the amine comprises ethylene diamine (EDA).

At 118, the substrate surface or processing chamber can be purged of unreacted amines or reaction byproducts.

In some embodiments, a plasma activation step can be used to re-activate the surface for the silyl halide to chemisorb. In one or more embodiments, a plasma activation step is not used and the silyl halide can chemisorb sufficiently without re-activation. At 120, the substrate may be exposed to an optional plasma process. The plasma exposure can occur with the exposure to the amine or as a separate process step. In some embodiments, there is no plasma exposure or subsequent purge 122. In one or more embodiments, the plasma comprises a species that does not become a part of the final film. For example, argon plasma may provide sufficient energy to react with the surface species to form the low k film. In some embodiments, there are substantially no argon atoms in the final film, meaning that there is less than 1 atomic % argon atoms (or other inert atoms) in the film. In some embodiments, the plasma comprises one or more of Ar, He, $N_2$, Ar/He, Ar/$N_2$, Ne, Kr or Xe.

The plasma exposure can occur at any suitable temperature, frequency, pressure and power. In some embodiments, the frequency of the plasma is one or more of 2 MHz, 13.56 MHz, 40 MHz, 60 MHz, 100 MHz, less than 2 MHz or greater than 100 MHz. In some embodiments, the frequency of the plasma is about 13.56 MHz. The plasma power of various embodiments is in the range of about 25 Watt to about 500 Watt, or about 50 Watt to about 400 Watt, or about 150 Watt to about 350 Watt or about 200 Watt to about 300 Watt. The plasma exposure duration of some embodiments is in the range of about 2 seconds to about 30 seconds, or in the range of about 5 seconds to about 15 seconds.

After the optional plasma exposure 120 and purge 122, the first sub-process 110 reaches decision 130. At decision 130, the first sub-process 110 can be repeated or the second sub-process 150 can be performed. The first sub-process 110 can be repeated any number of times before moving to the second sub-process 150. The first sub-process 110 and the second sub-process 150 can be alternated or reversed.

In the second sub-process 150, the substrate is again exposed to the silyl-halide at 152. The silyl-halide exposure in the second sub-process 150 can be the same silyl-halide or a different silyl-halide than that of the first sub-process 110. After exposure to the silyl-halide, the substrate or process chamber can be purged at 154.

At 156, the substrate can be exposed to an alkanolamine. Suitable alkanolamines include, but are not limited to,

4

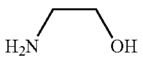

5

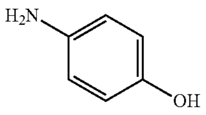

6

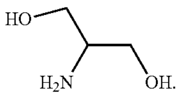

In some embodiments, the alkanolamine comprise ethanolamine (ETA).

At 158, the process chamber or substrate surface is again purged of unreacted alkanolamines or reaction by-products. In some embodiments, a plasma activation step can be used to re-activate the surface for the silyl halide to chemisorb. In one or more embodiments, a plasma activation step is not used and the silyl halide can chemisorb sufficiently without re-activation. At 160 and 162, respectively, the substrate can be exposed to an optional plasma and subsequent purge. The plasma exposure can be the same as that of the first sub-process or different.

At 170, after the second sub-process 150 is completed, the decision to repeat the second sub-process 150 is made. The second sub-process 150 can be repeated any suitable number of times before moving to an optional post-process 180. In some embodiments, after the second sub-process 150 is completed, the first sub-process 110 is performed.

The carbon, nitrogen and oxygen content of the film can be tuned by adjusting the number of times that the first sub-process 110 and the second sub-process 150 are performed. Additionally, the content of the film can be adjusted by changing the order and sequence of the first sub-process 110 and the second sub-process 150.

In one or more embodiments, the deposition is carried out at a temperature in the range of about 23° C. to about 550° C. In some embodiments, the deposition is carries out at a temperature less than or equal to about 500° C., 450° C., 400° C., 350° C., 300° C., 250° C., 200° C., 150° C., 125° C., or 100° C.

Figure 2:
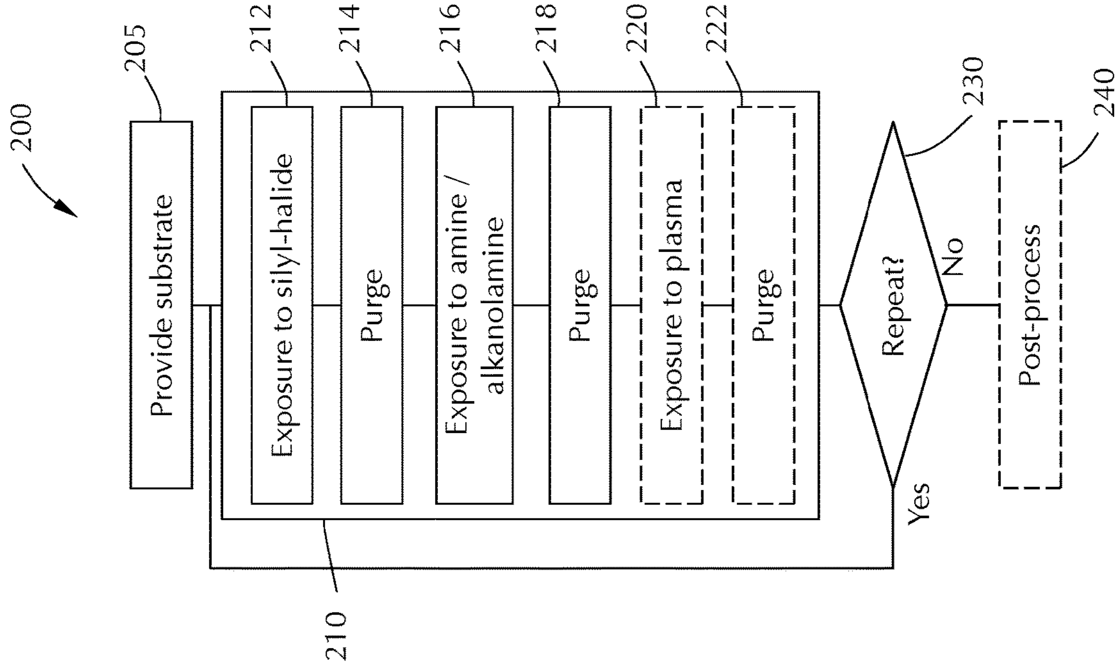
FIG. 2 shows a schematic representation of a process sequence in accordance with one or more embodiment of the disclosure.

FIG. 2 shows another embodiment of the process 200 in which a single sub-process 210 is employed. The embodiment illustrated in FIG. 2 may allow for the deposition of SiCON by ALD with carbon, nitrogen and oxygen compositional control. To control the composition, an amine and alkanolamine may be mixed in a single precursor exposure.

The amine and alkanolamine can be in prior to introduction into the processing chamber or within the processing chamber. The pulse sequence shown in process 200 starts at 205 with providing the substrate into a suitable position or situation for processing.

At 212, the substrate is exposed to the silyl halide precursor to allow the silyl-halide to chemisorb onto the substrate surface. After silyl halide exposure, at 214, the process chamber or substrate surface is purged of unreacted silyl halide and process byproducts.

At 216, the amine and alkanolamine are introduced to the substrate at the same time. The precursor flux ratios (alkanolamine/amine) can be adjusted to change the carbon, nitrogen and oxygen composition, the wet etch rate and/or k values of the final film. In some embodiments, the alkanolamine/amine ratio is in the range of about 10:1 to about 1:10, or in the range of about 5:1 to about 1:5, or in the range of about 4:1 to about 1:4, or in the range of about 3:1 t about 1:3, or in the range of about 2:1 to about 1:2, or in the range of about 1:1.5 to about 1.5:1, or about 1:1, or about 1.1:1, or about 1.2:1, or about 1.3:1 or about 1.4:1 or about 1.5:1, or about 1:1.1, or about 1:1.2, or about 1:1.3, or about 1:1.4 or about 1:1.5.

At 218, the process chamber or substrate surface is purged of unreacted amine and alkanolamine and reaction byproducts using an inert purge gas. Purging can be accomplished by removing all reactive gases from the processing chamber, or by passing the substrate through a gas curtain that isolates the particular region of the processing chamber. Suitable purge gases include, but are not limited to, nitrogen, argon, helium, hydrogen and mixtures thereof.

In some embodiments, a plasma activation step can be used to re-activate the surface for the silyl halide to chemisorb. In one or more embodiments, a plasma activation step is not used and the silyl halide can chemisorb sufficiently without re-activation. At 220, the substrate may be exposed to an optional plasma process. The plasma exposure can occur with the exposure to the amine or as a separate process step. In some embodiments, there is no plasma exposure or subsequent purge 222. The plasma species and conditions can be the same as those described with respect to the embodiment of FIG. 1. In some embodiments, the plasma comprises one or more of Ar, He, $N_2$, Ar/He, Ar/$N_2$, Ne, Kr or Xe. In some embodiments, the frequency of the plasma is one or more of 2 MHz, 13.56 MHz, 40 MHz, 60 MHz, 100 MHz, less than 2 MHz or greater than 100 MHz. In some embodiments, the frequency of the plasma is about 13.56 MHz. The plasma power of various embodiments is in the range of about 25 Watt to about 500 Watt, or about 50 Watt to about 400 Watt, or about 150 Watt to about 350 Watt or about 200 Watt to about 300 Watt. The plasma exposure duration of some embodiments is in the range of about 2 seconds to about 30 seconds, or in the range of about 5 seconds to about 15 seconds.

After the optional plasma exposure 220 and purge 222, a decision point 230 is reached. If the thickness of the film has reached a predetermined thickness, the process can move forward to an optional post-process 240. If the film is not at the predetermined thickness, the sub-process 210 can be repeated to increase the thickness of the film. The sub-process 210 can be repeated any suitable number of times to deposit a film having a predetermined thickness.

In some embodiments, a SiCO film is deposited without nitrogen. For depositions of SiCO the amine can be replaced with an alcohol. Suitable alcohols include, but are not limited to,

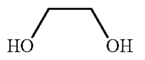 7

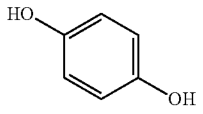 8

R—OH. 9

In some cases when using an oxygen-containing molecule such as an alkanolamine, an alcohol, ozone, water, oxygen plasma or oxygen, the oxidation of the film is difficult to control and too much oxygen can be incorporated into the film. The inventors have surprisingly found that the use of halide-based siloxanes as the silicon and oxygen source can provide improved control over the oxygen content of the film. The siloxane precursors have a relative Si:O ratio that can translate into a similar Si:O ratio in the final film. The inventors have found that the siloxane can be chosen to control the oxygen content of the final film to be within the range of about 5 to 20 atomic percent. In some embodiments, the final film comprises oxygen and has an oxygen content less than or equal to about 30 atomic percent, 25 atomic percent, 20 atomic percent, 15 atomic percent, 10 atomic percent or 5 atomic percent. Some general formulas for suitable silyl halide-based siloxanes include $$X_3Si—O—(SiX_2)_n—O—SiX_3 \quad (A)$$

where n is 0 to 5 and each X is independently F, Cl, Br or I. In one or more embodiments, the siloxane comprises $Cl_3Si—O—SiCl_3$ (hexachlorodisiloxane; HCDSO) or $Cl_3Si—O—SiCl_2—O—SiCl_3$ (octachlorotrisiloxane; OCTSO).

(B)

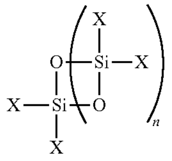

where n is 1 to 5 and each X is independently F, Cl, Br or I. In one or more embodiments, the siloxane comprises a compound of the formula (B) where n is 1 and each X is chlorine.

$$(X_3Si—O)_n—SiX_{4-n} \quad (C)$$

where n is 1 to 4 and each X is independently F, Cl, Br or I.

In some embodiments, the siloxane is a ringed compound having a 4 to 12 membered ring. The halogens can be independently selected from F, Cl, Br or I. A suitable example of a six-membered ring siloxane is shown as formula (D). Those skilled in the art will understand that the chlorines can be substituted with other halogen on an independent basis.

(D)

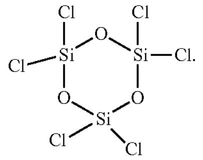

Figure 3:
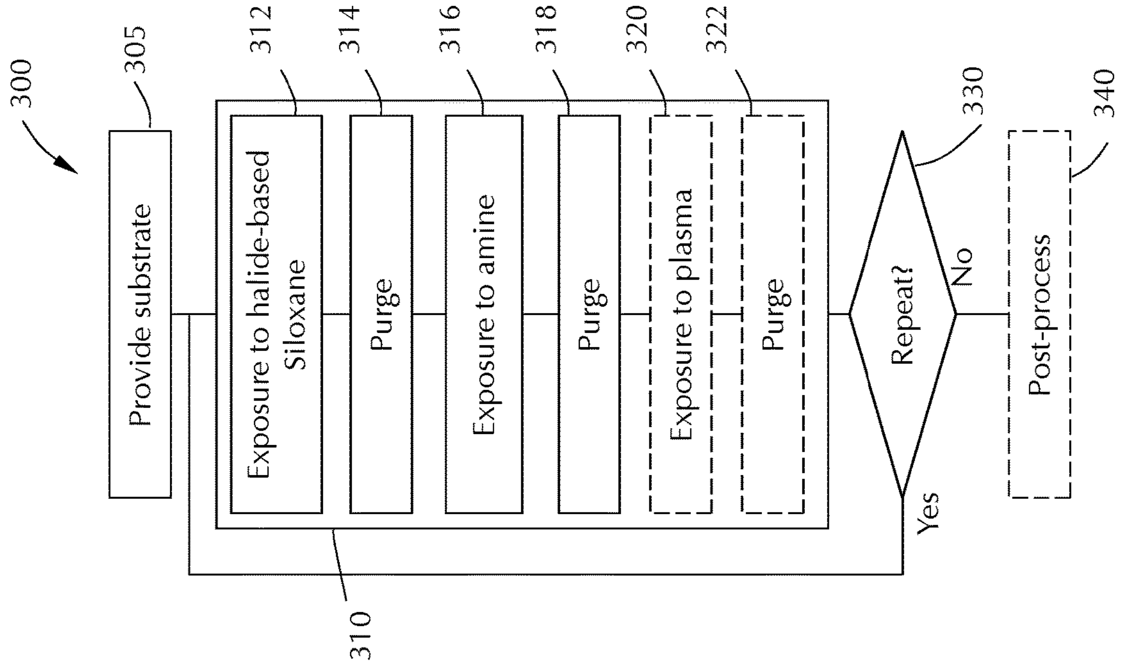
FIG. 3 shows a schematic representation of a process sequence in accordance with one or more embodiment of the disclosure.

FIG. 3 shows another embodiment of the process 300. At 305, a substrate is provided in condition for deposition in a suitable processing environment. A single sub-process 310 is illustrated and may allow for the deposition of SiCON films with carbon, nitrogen and oxygen compositional control.

At 312, the substrate is exposed to the halide-based siloxane precursor to allow the precursor to chemisorb onto the substrate surface. The siloxane precursor can be exposed to the substrate surface for any suitable length of time, at any suitable pressure and temperature. In some embodiments, the siloxane precursor is exposed to the substrate for a time in the range of about 0.25 seconds to about 5 seconds, or about 0.5 seconds to about 2 seconds. In some embodiments, the pressure of the siloxane is in the range of about 0.5 Torr to about 5 Torr, or about 1 Torr to about 4 Torr, or about 1.1 Torr. The processing temperature of some embodiments, is in the range of about 150° C. to about 500° C., or about 200° C. to about 400° C., or about 230° C. to about 340° C., or about 290° C.

After exposure to the siloxane precursor, at 314, the process chamber or substrate surface is purged of unreacted precursor and process byproducts. The purge time can be any suitable length of time. For example, the purge time can be in the range of about 2 seconds to about 20 seconds, or in the range of about 5 seconds to about 10 seconds.

At 316, the substrate is exposed to an amine to incorporate nitrogen and/or carbon into the film. The carbon can be incorporated into the film as part of the siloxane precursor or with the amine or through an additional chemical exposure (not shown). After the amine has reacted with the substrate surface, at 318, the process chamber or substrate surface is purged of unreacted amine and reaction by-products using an inert purge gas. Purging can be accomplished by removing all reactive gases from the processing chamber, or by passing the substrate through a gas curtain that isolates the particular processing region of the processing chamber. Suitable purge gases include, but are not limited to, nitrogen, argon, helium, hydrogen and mixtures thereof.

In some embodiments, a plasma activation step can be used to re-activate the surface for subsequent siloxane exposure. In one or more embodiments, a plasma activation step is not used and the siloxane can chemisorb sufficiently without re-activation. At 320, the substrate may be exposed to an optional plasma process. The plasma exposure can occur with the exposure to the amine or as a separate process step. In some embodiments, there is no plasma exposure or subsequent purge 322. The plasma species and conditions can be the same as those described with respect to the embodiment of FIG. 1. In some embodiments, the plasma comprises one or more of Ar, He, $N_2$, Ar/He, Ar/$N_2$, Ne, Kr or Xe. In some embodiments, the frequency of the plasma is one or more of 2 MHz, 13.56 MHz, 40 MHz, 60 MHz, 100 MHz, less than 2 MHz or greater than 100 MHz. In some embodiments, the frequency of the plasma is about 13.56 MHz. The plasma power of various embodiments is in the range of about 25 Watt to about 500 Watt, or about 50 Watt to about 400 Watt, or about 150 Watt to about 350 Watt or about 200 Watt to about 300 Watt. The plasma exposure duration of some embodiments is in the range of about 2 seconds to about 30 seconds, or in the range of about 5 seconds to about 15 seconds.

After the optional plasma exposure 320 and purge 322, a decision point 330 is reached. If the thickness of the film has reached a predetermined thickness, the process can move forward to an optional post-process 340. If the film is not at the predetermined thickness, the sub-process 310 can be repeated to increase the thickness of the film. The sub-process 310 can be repeated any suitable number of times to deposit a film having a predetermined thickness.

Some embodiments of the disclosure occur in a spatial atomic layer deposition chamber in which a film is formed by moving the substrate between different process regions within the processing chamber. The different process regions are separated by gas curtains comprising a combination of purge gas streams and exhaust streams. In some embodiments, the substrate is positioned within a first process region of a processing chamber. In the first process region, the substrate surface is exposed to a siloxane precursor. The substrate is then laterally moved through a gas curtain to a second process region of the processing chamber. The gas curtain purges unreacted siloxane precursor from the surface of the substrate. In the second process region, the substrate surface is exposed to an amine to form the SiCON film. The substrate can then be laterally moved through another gas curtain to a different part of the processing chamber. The gas curtain purges unreacted amine from the surface of the substrate.

The substrate can be moved to a third process region of the processing chamber for plasma re-activation or to another first process region for repeated exposure to the siloxane. The plasma re-activation may occur in a third process region and/or fourth process region. The substrate can be laterally moved from the third process region through another gas curtain to repeat exposure to the various process regions or to complete the deposition. In some embodiments, the processing chamber comprises more than one first process region, second process region and third process region and the substrate can be cycles between the process regions to deposit a film of a predetermined thickness. Those skilled in the art will understand that the process shown in FIGS. 1 through 3 can also be performed in a spatial ALD chamber in which the different reactive gases are flowed into separate process regions of the process chamber.

ALD of SiCON Using EDA and ETA and Hexachlorodisilane

A pulse sequence according to FIG. 2 was used with hexachlorodisilane (HCDS), ethylene diamine (EDA) and ethanolamine (ETA), where each step was separated by a 10 s Ar purge. The pulse lengths for the HCDS and EDA+ETA were 0.5 s. The Ar plasma had a power of 100 W for a total pulse time of 5 s. There were a total of 200 cycles and the temperature was 350° C.

To evaluate the ability to tune the carbon, nitrogen and oxygen content, the precursor ratios were varied starting with only EDA (Chem A) and slowly increasing the ETA concentration (Chem B) until only ETA was used. With the Chem A only (EDA only) resonances corresponding to SiCN were observed and as the ETA/EDA precursor ratio (A/B) was increased, the Si—C/SiN peaks shifted towards the Si—O region, indicating that O incorporation has occurred. Table 1 shows the XPS data corresponding to the films deposited as described above. According to the data, as the ETA/EDA ratio was increased the oxygen levels increased and the nitrogen decreased showing that it is possible to tune the composition by changing the ETA/EDA ratio.

TABLE 1

| Sample | % C | % N | % O | % Si |
|---|---|---|---|---|
| Chem A | 16.25 | 35.28 | 6.05 | 35.14 |
| B/A = 1 | 18.60 | 35.03 | 8.24 | 35.68 |
| B/A = 1.1 | 16.02 | 34.56 | 10.03 | 36.49 |
| B/A = 1.2 | 12.01 | 25.08 | 24.35 | 34.44 |
| B/A = 1.3 | 7.80 | 14.01 | 36.87 | 32.50 |

Deposition of SiCON Using Hexachlorodisiloxane and Octachlorotrisiloxane with EDA The pulse sequence shown in FIG. 3 was followed using either hexachlorodisiloxane (HCDSO) or octachlorotrisiloxane (OCTSO) as the siloxane precursor and EDA as the amine. The reactor pressure was ~3-5 T and the substrate temperature was ~350° C. The HCDSO and OCTSO were kept at room temperature and pulsed for 1 s and the EDA was also kept at room temperature and pulsed for 0.5 s. A 5 s argon plasma activation step was used and the plasma power was kept at 200 W.

It was observed that when no plasma was used to reactivate the surface the growth rate dropped to 0.11 Å/cycle. At plasma powers of 100-300 W the observed growth rate was ~0.25 Å/cycle for both silicon precursors.

Table 2 shows the XPS data and wet etch rate ratio (WERR) measured relative to thermal silicon oxide in 1% HF for films deposited using HCDSO and OCTSO. The data indicated that as the O/Si ratio in the precursor was increased, the C and N decreased and the O slightly increased. Use of both precursors resulted in relatively low oxygen concentrations (8-12%) allowing control to decrease k and keep the wet etch rate (WER) in 1% HF relatively high. Controlling oxygen content to values less than 30% is very difficult using typical O sources ($O_2$, $H_2O$, ozone, O2 plasma). Even using less oxidizing oxygen sources such as ethanolamine or alcohols can lead to oxygen incorporation of up to 40-50%. The WERRs for films deposited with a power of 200 W are ~0.08 for HCDSO and OCTSO. Accordingly, it has been found that more oxygen can be added to the film while keeping a lower WER.

TABLE 2

| Sample | % C | % N | % O |
|---|---|---|---|
| HCDSO/EDA/200 W | 17.15 | 37.1 | 6.65 |
| HCDSO/EDA/300 W | 17.75 | 36.6 | 7.27 |
| OCTSOSO/EDA/200 W | 14.71 | 34.39 | 11 |
| OCTSOSO/EDA/300 W | 16.06 | 33.3 | 11.98 |

Experiments were performed with HCDSO as the siloxane and EDA as the amine under varying conditions. The pulse train was HCDSO/10 s purge/0.5 s EDA/10 s purge/10 s Ar plasma/10 s purge. The growth per cycle (GPC) in Å/cycle and wet etch rate ratio (in 1% HF) relative to thermal oxide are shown as a function various parameters are shown. Table 3 shows data comparing the HCDSO pulse time for a process train using 200 W argon plasma at a pressure of 1.1 Torr and substrate temperature of 340° C. Table 4 shows data comparing the HCDSO pressure for a process train of 1 second HCDSO, 200 W argon plasma at 4 Torr and substrate temperature of 340° C. Table 5 shows data comparing the process temperature for a process train of 1 second HCDSO, 200 W argon plasma at 1.1 Torr. Table 6 shows data comparing the time during purge for a process train using a 200 W argon plasma at 1.1 Torr and a substrate temperature of 340° C.

TABLE 3

| HCDSO Pulse Length (sec) | GPC (Å/cycle) | WERR |
|---|---|---|
| 0.5 | 0.17 | 0.08 |
| 1 | 0.25 | 0.11 |
| 1.5 | 0.25 | 0.11 |
| 2 | 0.23 | 0.06 |

TABLE 4

| Pressure (Torr) | GPC (Å/cycle) | WERR |
|---|---|---|
| 1.1 | 0.25 | 0.11 |
| 4 | 0.23 | 0.10 |

TABLE 5

| Temperature (° C.) | GPC (Å/cycle) | WERR |
|---|---|---|
| 230 | 0.29 | 2.86 |
| 290 | 0.19 | 0.49 |
| 340 | 0.21 | 0.11 |

TABLE 6

| Purge Time (sec) | GPC (Å/cycle) | WERR |
|---|---|---|
| 5 | 0.15 | 0.42 |
| 10 | 0.25 | 0.11 |

The plasma re-activation step was studied for a pulse train HCDSO/10 s purge/0.5 s EDA/10 s purge/10 s Ar plasma/10 s purge. Table 7 shows the growth per cycle and wet etch rate ratio as a function of the plasma power for a process of 200 cycles at 4 Torr and 340° C. Table 8 shows the growth per cycle and wet etch rate ratio as a function of the plasma duration for a process of 200 cycles at 4 Torr and 340° C.

TABLE 7

| Plasma Power (W) | GPC (Å/cycle) | WERR |
|---|---|---|
| Thermal (no plasma) | 0.11 | 0.98 |
| 100 | 0.16 | 0.12 |
| 150 | 0.22 | 0.10 |
| 200 | 0.25 | 0.11 |
| 300 | 0.26 | 0.18 |

TABLE 8

| 200 W Plasma Duration (sec) | GPC (Å/cycle) | WERR |
|---|---|---|
| Thermal (no plasma) | 0.11 | 0.98 |
| 5 | 0.23 | 0.11 |
| 10 | 0.25 | 0.11 |
| 15 | 0.26 | 0.16 |

The composition of the plasma re-activation step was studied for a pulse train of HCDSO/10 s purge/0.5 s EDA/10 s purge/10 s Ar+$H_2$ plasma/10 s purge. The process conditions were varied the growth per cycle and wet etch rate ratios. Tables 9 and 10 show the data for a 25:75 mix of $H_2$:Ar, a 50:50 mix of $H_2$:Ar and a 75:25 mix of $H_2$:Ar.

TABLE 9

| Plasma Power (W) | GPC (Å/cycle) 25 $H_2$:75 Ar | 50 $H_2$:50 Ar | 75: $H_2$:25 Ar |
|---|---|---|---|
| 50 | 0.18 | 0.12 | 0.15 |
| 100 | 0.33 | 0.39 | 0.23 |
| 200 | 0.61 | 0.38 | 0.29 |

TABLE 10

| Plasma Power (W) | WERR 25 $H_2$:75 Ar | 50 $H_2$:50 Ar | 75: $H_2$:25 Ar |
|---|---|---|---|
| 50 | 0.10 | 0.18 | 0.22 |
| 100 | 1.85 | 2.14 | 1.5 |
| 200 | 4.0 | 2.25 | 2.9 |

Table 11 shows data for the elemental composition and wet etch rate ratio as a function of plasma power for a process train of 1 s HCDSO/10 s purge/0.5 s EDA/10 s purge/10 s 1:1 $H_2$:Ar plasma/10 s purge.

TABLE 11

| Plasma | Composition (%) | | | |
|---|---|---|---|---|
| Power (W) | C | O | N | WERR |
| 50 | 5.86 | 14.53 | 39.21 | 0.18 |
| 100 | 10.50 | 9.36 | 42.57 | 2.14 |
| 200 | 10.34 | 8.69 | 43.13 | 2.25 |

A pulse train comprising OCTSO/10 s purge/0.5 s EDA/10 s purge/10 s Ar plasma/10 s purge was studied under various conditions. The growth per cycle and wet etch rate ratio as a function of the OCTSO pulse length, purge time and plasma power are collected in Tables 12 to 14, respectively.

TABLE 12

| OCTSO Pulse Length (sec) | GPC (Å/cycle) | WERR |
|---|---|---|
| 1 | 0.17 | 0.10 |
| 1.5 | 0.16 | 0.08 |
| 2 | 0.18 | 0.22 |
| 3 | 0.19 | 0.20 |

TABLE 13

| Purge Time (sec) | GPC (Å/cycle) | WERR |
|---|---|---|
| 5 | 0.13 | 0.12 |
| 10 | 0.17 | 0.10 |

TABLE 14

| Plasma Power (W) | GPC (Å/cycle) | WERR |
|---|---|---|
| 100 | 0.15 | 0.05 |
| 200 | 0.17 | 0.10 |
| 300 | 0.18 | 0.24 |

The precursor usage in nanograms per pulse for HCDSO and OCTSO was studied using the same pulse train. The consumption per pulse of HCDSO was 8.3 ng/pulse. The consumption per pulse of OCTSO was 1.0 ng/pulse. The OCTSO used less precursor per pulse than HCDSO and has similar film properties as shown in Tables 1 through 14.

Figure 4:
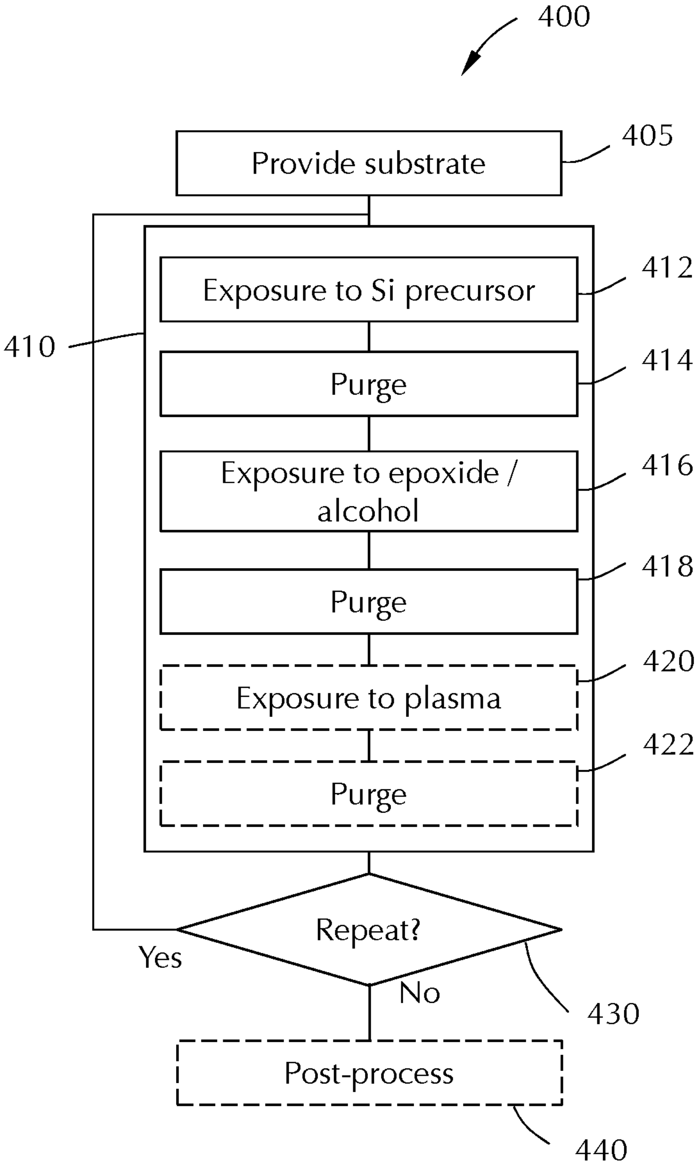
FIG. 4 shows a schematic representation of a process sequence in accordance with one or more embodiment of the disclosure.

FIG. 4 shows another embodiment of the disclosure in which an epoxide reactant is used to deposit a silicon-containing film. The method 400 can be a thermal ALD or PEALD process to deposit SiCO and SiCON films using epoxides as the C and O source in combination with various silylhalides, silylamides or siloxane precursors. The epoxide group is advantageously susceptible to ring opening at deposition temperature of greater than or equal to about 150° C., enabling direct insertion into a SiN or SiCl bond to form a SiOC bond. Some embodiments advantageously provide methods that do not severely oxidize the film, leading to a carbon rich film.

One or more embodiments of the disclosure are directed to methods of depositing a silicon-containing film. The methods comprise sequentially exposing a substrate surface to a silicon precursor and a reactant.

In some embodiments, the ALD of SiCO(N) using an organic molecule such as epoxides, alcohols, diols, etc., as the C and O source and silyl halide ($SiX_xR_{4-x}$) where X is F, Cl, Br, I and R is H, alkyl or aryl (e.g., DCS, HCDS, TCS, $SiCl_4$) based molecules or silyl amide ($Si(NRR')_xR''_{4-x}$ where R, R' and R" are H, alkyl or aryl; e.g. BDEAS, BTBAS, TDMAS) or siloxanes (e.g., HCDSO, OCTSO) as the Si source.

Suitable epoxides and diols include, but are not limited to, epoxides with the structure represented by

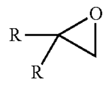
or
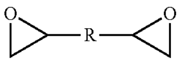

where each R is independently H, C1-C10 alkyl, C1-C10 alkenyl, C1-C10 alkynyl, cycloalkyl with 1 to 10 carbons, ether or silane.

In some embodiments, the reactant comprises one or more of

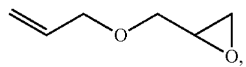
,
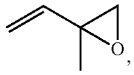
,
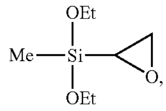
,
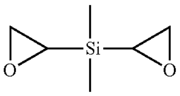
or
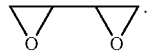
.

The ALD SiCO can be deposited by using the pulse sequence shown in FIG. 4. In a thermal ALD cycle, the Si precursor is pulsed into the chamber and reacts with an O terminated Si surface. Excess precursor is purged out from the chamber. An epoxide is then pulsed in to the chamber to react with Si-halide or Si-amide bonds. Due to having two reactive sites, diepoxides or diols may be candidates for a thermal ALD of SiCO film.

PEALD of SiCO(N) can be achieved by using a Si precursor (Si-amide, halide or siloxane) is pulsed to the chamber followed by purging out the excess reactant. Then the surface is exposed to an epoxide, which reacts with Si-amide (or Si-halide) bonds. Excess epoxide or diol is purged out of the chamber and the reactive sites are regenerated by using a plasma exposure. Using $H_2$ or Ar plasma can lead to a SiCO film whereas $NH_3$ or $N_2$ plasma leads to SiCON film. Repeating these process sequences can generate a SiCO or SiCON film.

Referring to FIG. 4, a pulse sequence according to one or more embodiment of method 400 starts at 405 with providing the substrate into a suitable position or situation for processing. The sub-process 410 shows both a thermal process and a plasma enhanced process.

At 412, the substrate is exposed to the silicon precursor to allow the silicon species to chemisorb onto the substrate surface. In some embodiments, the silicon precursor comprises substantially no halogen atoms. As used in this regard, the term "substantially no halogen atoms" means that the silicon precursor comprises no more than about 5%, 4%, 3%, 2%, 1% or 0.5% halogen atoms on an atomic basis.

In some embodiments, the silicon precursor comprises a silylamine. The silylamine can be any suitable silylamine including but not limited to $H_3SiNH_2$ or $R_3SiNR'_2$, where each R and R' are independently selected from hydrogen, C1-C10 alkyl, C1-C10 alkenyl, C1-C10 alkynyl or cycloalkyl group.

After silane exposure, at 414, the process chamber or substrate surface is purged of unreacted silicon precursor and any process byproducts that might be generated.

At 416, the substrate surface is exposed to a reactant comprising one or more of an epoxide or alcohol. In some embodiments, the reactant consists essentially of an epoxide. As used in this regard, the term "consists essentially of" means that the reactive species of the reactant is greater than or equal to about 95%, 98% or 99% epoxide species on a molecular basis.

The epoxide of some embodiments comprises a species having the structural formula (E)

(E)

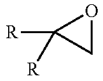

where each R is independently H, C1-C10 alkyl, C1-C10 alkenyl, C1-C10 alkynyl, cycloalkyl with 1 to 10 carbons, ether or silane.

In some embodiments, the epoxide comprises one or more of (E1)

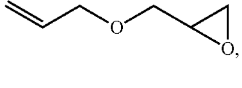

, (E2)

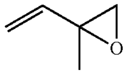

or (E3)

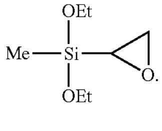

.

In some embodiments, the epoxide comprises a species having the structural formula (F)

(F)

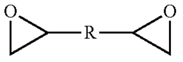

where R is a C1-C10 alkyl, C1-C10 alkenyl, C1-C10 alkynyl, cycloalkyl with 1 to 10 carbons, ether or silane.

In some embodiments, the epoxide comprises one or more of (F1)

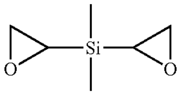

or (F2)

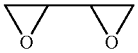

.

The epoxide of some embodiments has an oxygen to carbon atom ratio greater than 1:1, 1:2, 1:3 or 1:4. The oxygen to carbon ratio can have an effect on the carbon content of the final silicon-containing film.

In some embodiments, the epoxide or alcohol reactant comprises substantially no nitrogen atoms. As used in this regard, the term "substantially no nitrogen atoms" means that the reactive species of the reactant less than or equal to about 5%, 4%, 3%, 2%, 1% or 0.5% nitrogen atoms on an atomic basis.

At 418, the process chamber or substrate surface is purged of unreacted epoxide or alcohol and reaction by-products using an inert purge gas. Purging can be accomplished by removing all reactive gases from the processing chamber, or by passing the substrate through a gas curtain that isolates the particular region of the processing chamber. Suitable purge gases include, but are not limited to, nitrogen, argon, helium, hydrogen and mixtures thereof.

In some embodiments, the sub-process 410 is completed after 418 and moves to decision point 430. The method 400 may comprise repeating the sequential exposure to the silicon precursor 412, purge 414, reactant 416 and purge 418 to form a film having a predetermined thickness.

In some embodiments, a plasma activation step can be used to re-activate the surface for the silicon precursor to chemisorb, or include dopant elements, or add nitrogen to the film. At 420, the substrate may be exposed to an optional plasma process. In some embodiments, there is no plasma exposure or subsequent purge 422. In some embodiments, the method 400 further comprises exposing the silicon-containing film generated by the sequential exposure to the silicon precursor and the reactant to a plasma between each successive exposure to the silicon precursor and the reactant. In some embodiments, the silicon-containing film is exposed to the plasma after in the range of about 1 to about 100 exposures to each of the silicon precursor and reactant. In some embodiments, the silicon-containing film is exposed to the plasma after a thickness in the range of about 1 nm to about 100 nm has been formed.

In some embodiments, the plasma comprises one or more of Ar, He, $N_2$, Ar/He, Ar/$N_2$, Ne, Kr or Xe. In some embodiments, the plasma comprises argon and hydrogen. In some embodiments, the plasma comprises nitrogen and the silicon-containing film comprises SiCON.

In some embodiments, the plasma consists essentially of argon and hydrogen. As used in this regard, the term "consists essentially of" means that the argon and hydrogen make up greater than or equal to about 95%, 98% or 99% of the plasma species on a molecular basis. The amount of hydrogen in the argon plasma of some embodiments is greater than or equal to about 5%, 6%, 7%, 8%, 9%, 10%, 15% or 20% hydrogen on a molecular basis.

In some embodiments, the frequency of the plasma is one or more of 2 MHz, 13.56 MHz, 40 MHz, 60 MHz, 100 MHz, less than 2 MHz or greater than 100 MHz. In some embodiments, the frequency of the plasma is about 13.56 MHz. The plasma power of various embodiments is in the range of about 25 Watt to about 500 Watt, or about 50 Watt to about 400 Watt, or about 150 Watt to about 350 Watt or about 200 Watt to about 300 Watt. The plasma exposure duration of some embodiments is in the range of about 2 seconds to about 30 seconds, or in the range of about 5 seconds to about 15 seconds.

After the optional plasma exposure 420 and purge 422, a decision point 430 is reached. If the thickness of the film has reached a predetermined thickness, the process can move forward to an optional post-process 440. If the film is not at the predetermined thickness, the sub-process 410 can be repeated to increase the thickness of the film. The sub-process 410 can be repeated any suitable number of times to deposit a film having a predetermined thickness.

In some embodiments, the reactant exposure (i.e., exposure to epoxide/alcohol) at 416 includes plasma. The plasma component of the reactant is referred to as a reactant plasma to distinguish between a plasma exposure that occurs with the epoxide from a post-reactant plasma treatment (e.g., at 420).

The reactant plasma can include a process gas selected from one or more of hydrogen, helium, neon, argon, krypton, xenon, ammonia, nitrogen, CO and/or $CO_2$. In some embodiments, the reactant plasma comprises argon with less than about 1% non-argon atoms, on an atomic basis. In some embodiments, the reactant plasma comprises a mixture of hydrogen and argon. The composition of the reactant plasma comprises substantially only argon. As used in this regard, the term "substantially only argon" means that the reactant plasma is greater than or equal to about 95%, 98% or 99% argon on a molar basis. The reactant plasma composition is in addition to the epoxide species. In some embodiments, the reactant plasma comprises hydrogen/argon mixture where the hydrogen is present in an amount in the range of about 1% to about 100%, or in the range of about 2% to about 90%, or in the range of about 3% to about 80%, or in the range of about 4% to about 65%, or in the range of about 5% to about 50%, or about 10% to about 40%, or about 15% to about 35%, or about 20% to about 30%, or about 25% on a molar basis.

The reactant plasma of some embodiments is a low power plasma. As used in this regard, the term "low power plasma" means that the plasma power is sufficient to activate the organic precursors (i.e., epoxide) without promoting self-decomposition of the epoxide (or any carbon and oxygen source), which might result in poor film conformality. In some embodiments, the reactant plasma power is less than or equal to about 300 W, 250 W, 200 W, 150 W, 100 W or 50 W. In some embodiments, the reactant plasma was a direct plasma with a power in the range of about 1 to about 500 W, or in the range of about 50 to about 400 W, or in the range of about 100 to about 300 W. In some embodiments, the reactant plasma is a remote plasma with a power in the range of about 100 to about 2000 W, or in the range of about 200 to about 1500 W, or in the range of about 300 to about 1000 W.

In some embodiments, the reactant plasma is generated within the processing chamber using the substrate or substrate support as an electrode (referred to as a direct plasma). In some embodiments, the reactant plasma is generated outside of the process region and flowed into the process region. This can be referred to as a remote plasma. Those skilled in the art will be familiar with the plasma generation components and electrical connections (e.g., coaxial transmission lines, match circuitry).

Exposure to the reactant at 416 can be simultaneous, continuous or pulsed. In some embodiments, the reactant plasma and the reactant are present at the substrate surface at the same time. In some embodiments, the reactant plasma gas (e.g., $H_2$/Ar) and the reactant (e.g., an epoxide) are present at the substrate surface at the same time and the plasma gas is ignited to form a plasma in pulses.

In some embodiments, the reactant is pulsed into the reactant plasma at the substrate surface. For example, the reactant plasma may be exposed to the substrate surface for a total of 10 seconds and the reactant (e.g., epoxide) is pulsed into the plasma for less than one second. The reactant pulse can occur at any time during the duration of the reactant exposure. In some embodiments, the reactant is pulsed into the reactant plasma at the beginning of the reactant exposure at 416. In some embodiments, the reactant is pulsed into the reactant plasma at the end of the reactant exposure at 416. In some embodiments, the reactant is pulsed into the reactant plasma in the middle of the reactant plasma exposure.

In some embodiments, the silicon-containing film comprises greater than about 10% carbon on an atomic basis. In some embodiments, the silicon-containing film has a wet etch rate ratio of less than or equal to about 0.15, 0.14, 0.13, 0.12, 0.11, 0.10, 0.09, 0.08, 0.07, 0.06, 0.05, 0.04, 0.03, 0.02, 0.01, 0.009, 0.008, 0.007, 0.006 or 0.005.

EXAMPLES

PEALD of SiCO Using HCDS and Allyl Glycidyl Ether

The step of the pulse sequence used for this example is separated by a 10 s Ar purge. The pulse lengths for the hexachlorodisilane and epoxide time were 0.5 second and 1 second, respectively. The allyl epoxide ampoule was maintained at 40-60° C. The growth-per-cycle (GPC) and wet etch rate ratio (WERR) were saturated at 50° C. ampoule temperature as shown in Table 15. GPC remained similar from 150° C. to 350° C. and the WERR lowered as the deposition temperature was increased, as shown in Table 16.

TABLE 15

| | GPC (Å/cycle) | | |
|---|---|---|---|
| Ampoule Temp (° C.) | Si | $SiO_2$ | WERR |
| 40 | 0.222 | 0.207 | 0.1 |
| 50 | 0.266 | 0.238 | 0.06 |
| 60 | 0.273 | 0.246 | 0.06 |

TABLE 16

| | GPC (Å/cycle) | | |
|---|---|---|---|
| Substrate Temp (° C.) | Si | $SiO_2$ | WERR |
| 150 | 0.308 | 0.250 | 0.14 |
| 200 | 0.307 | 0.270 | 0.03 |

TABLE 16-continued

| | GPC (Å/cycle) | | |
|---|---|---|---|
| Substrate Temp (° C.) | Si | $SiO_2$ | WERR |
| 275 | 0.281 | 0.255 | 0.02 |
| 350 | 0.284 | 0.263 | 0.01 |

Table 17 shows the plasma power splits for the process. The WER saturated whereas GPC increased with higher plasma power. The film had a very low WER of 0.3 Å/min in 1:100 HF. The k value measured for this film was in the range of 2.8-3.2.

TABLE 17

| | GPC (Å/cycle) | | |
|---|---|---|---|
| Plasma Power (W) | Si | $SiO_2$ | WERR |
| 100 | 0.265 | 0.238 | 0.06 |
| 200 | 0.417 | 0.405 | 0.01 |
| 300 | 0.690 | 0.697 | 0.01 |
| 400 | 1.065 | 1.128 | 0.005 |

The IR spectra of SiCO films grown at different plasma power showed a peak at 995 $cm^{-1}$. An IR plot comparison of SiCO film with $SiO_2$, SiCN and SiN films showed that the peak corresponding to Si—O stretching vibration in SiCO film is shifted to 995 $cm^{-1}$, which is in between the $SiO_2$ and SiCN stretching frequencies. The elemental composition of the HCDS-epoxide-$H_2$—Ar plasma process showed a film with ~19% C.

PEALD of SiCO Using BDEAS and Allyl Glycidyl Ether

Conformal SiCO(N) films were obtained using silyl amide (BDEAS) and epoxide. The silyl amide increased the reactivity of the Si source towards O terminated SiCO layer leading to a more conformal film compared to the film obtained by HCDS process. XPS results also indicated that the C concentration in the film is increased to ~27%. The k values for the film was maintained between 2.8-3.2 and the etch rate of <1 Å/min in 1:100 HF.

PEALD of SiCO Using BDEAS and Ethylene Glycol

As silyl amides are reactive towards O-terminated surfaces, a SiCO film was obtained with a better growth per cycle (GPC) by using a diol such as ethylene glycol as C and O source. Conformal SiCO films were obtained by using the pulse sequence BDEAS-ethylene glycol-$H_2$—Ar plasma. The GPC for this process was ~3 times higher than BDEAS-allyl glycidyl ether. The process resulted in good conformality of the film and XPS analysis indicates that there was ~11% C in the film.

PEALD of SiCO Using BDEAS and Allyl Glycidyl Ether/Plasma

SiCO films were formed using a two-step process as in FIG. 7 where the reactant exposure included a reactant plasma. Samples were prepared following a pulse train of 1 second BDEAS, 10 seconds purge, 7 seconds of 25% $H_2$/Ar plasma with 0.1 second pulse of allyl glycidyl ether and a 10 second purge. The film was formed from 200 cycles at 330° C. with the BDEAS delivered using a bubbler at room temperature and the allyl glycidyl ether delivered using a bubbler at 40° C. The growth per cycle and wet etch rate ratios at listed in Table 18.

TABLE 18

| Plasma Power (W) | GPC (Å/cycle) | WERR |
|---|---|---|
| 50 | 0.19 | 0.12 |
| 100 | 0.18 | 0.07 |

The pulse length of the allyl glycidyl ether was varied and the growth per cycle was observed. At a pulse length of 0.1 second, the GPC was 0.18; at a pulse length of 0.2 seconds, the GPC was 0.19; and at a pulse length of 0.3 seconds, the GPC was 0.19.

A comparison of the infrared spectra for a process without reactant plasma (a three-step process) and a process using the reactant plasma (a two-step process) was studied. The two-step process train was 1 second BDEAS, 10 seconds purge, 0.2 seconds allyl glycidyl ether in a 7 second 25% $H_2$/Ar plasma and 10 second purge. The three-step process train was 1 second BDEAS, 10 seconds purge, 1 second allyl glycidyl ether, 10 second purge, 5 seconds 25% $H_2$/Ar plasma and 10 second purge. The IR spectra of the two-step process showed peaks consistent with $CH_2$ groups that were not observed from the three-step process.

The plasma composition for a two-step process was varied and the growth per cycle and wet etch rate ratio was observed. The data are collected in Table 19.

TABLE 19

| Plasma Composition | GPC (Å/cycle) | WERR |
|---|---|---|
| Ar only | 0.14 | 0.10 |
| 25% $H_2$/Ar | 0.19 | 0.07 |
| 50% $H_2$/Ar | 0.21 | 0.09 |

The growth per cycle and wet etch rate ratio as a function of substrate temperature was studied for the two-step process. The two-step process demonstrated ALD behavior for each of the temperatures studied. The results are collected in Table 20.

TABLE 20

| Temperature (° C.) | GPC (Å/cycle) | WERR |
|---|---|---|
| 200 | 0.33 | 0.12 |
| 275 | 0.23 | 0.08 |
| 330 | 0.19 | 0.07 |

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa. Use of the terms "expose to a substrate surface" and "flow" is intended to encompass both processes.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a silicon-containing film, the method comprising sequentially exposing a substrate surface to a silicon precursor comprising $H_3SiNH_2$ or $R_3SiNR'_2$, where each R and R' in the silicon precursor are independently selected from hydrogen, C1-C10 alkyl, C1-C10 alkenyl, C1-C10 alkynyl, or a cycloalkyl group and a reactant comprising

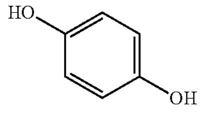

8

2. The method of claim 1, further comprising repeating sequential exposure to the silicon precursor and the reactant to form a film having a predetermined thickness.

3. The method of claim 2, further comprising exposing the silicon-containing film to a plasma between each successive exposure to the silicon precursor and reactant.

4. The method of claim 3, wherein the plasma comprises argon and hydrogen.

5. The method of claim 4, wherein the plasma comprises greater than or equal to about 5% hydrogen on a molecular basis.

6. The method of claim 3, wherein the plasma comprises nitrogen and the silicon-containing film comprises SiCON.

7. The method of claim 1, wherein the reactant further comprises a reactant plasma.

8. The method of claim 1, wherein the silicon-containing film comprises greater than about 10% carbon on an atomic basis.

9. A method of depositing a silicon-containing film, the method comprising:

exposing a substrate surface to a silicon precursor comprising $H_3SiNH_2$ or $R_3SiNR'_2$, where each R and R' in the silicon precursor are independently selected from hydrogen, C1-C10 alkyl, C1-C10 alkenyl, C1-C10 alkynyl, or a cycloalkyl group;

purging unreacted silicon precursor from the substrate surface;

exposing the substrate surface to a reactant comprising

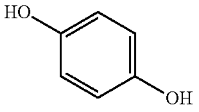

8 to form the silicon-containing film;

purging unreacted reactant from the substrate surface; and repeating exposure to the silicon precursor, purging unreacted silicon precursor, exposure to the reactant and purging unreacted reactant to form a silicon-containing film having a thickness.

10. A method of depositing a silicon-containing film, the method comprising:

exposing a surface of a substrate to a silicon precursor comprising $H_3SiNH_2$ or $R_3SiNR'_2$, where each R and R' in the silicon precursor are independently selected from hydrogen, C1-C10 alkyl, C1-C10 alkenyl, C1-C10 alkynyl, or a cycloalkyl group in a first process region of a processing chamber;

laterally moving the substrate through a gas curtain to a second process region of the processing chamber, the gas curtain purging unreacted silicon precursor from the surface of the substrate;

exposing the surface of the substrate to a reactant in the second process region of the processing chamber to form the silicon-containing film, the reactant comprising

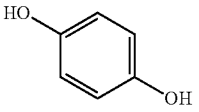

8 and a reactant plasma comprising 25% $H_2$ in Ar;

laterally moving the substrate through a gas curtain to a third process region of the processing chamber, the gas curtain purging unreacted reactant from the surface of the substrate;

optionally exposing the surface of the substrate to a plasma in the third process region of the processing chamber and laterally moving the substrate from the third process region of the processing chamber through a gas curtain, the plasma comprising argon with greater than or equal to about 5% hydrogen on a molecular basis; and repeating exposure to the first process region, the second process region and, optionally, the third process region to grow a silicon-containing film having a thickness, wherein the silicon-containing film comprises greater than about 10% carbon on an atomic basis.

* * * * *